(12) United States Patent
Lin

(10) Patent No.: US 8,919,980 B2
(45) Date of Patent: Dec. 30, 2014

(54) LED LIGHT GUIDE, LED LIGHT SOURCE MODULE AND DIRECT-TYPE LED TV

(71) Applicant: Hon Hai Precision Industry Co., Ltd., New Taipei (TW)

(72) Inventor: I-Thun Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 25 days.

(21) Appl. No.: 13/711,656

(22) Filed: Dec. 12, 2012

(65) Prior Publication Data
US 2014/0036161 A1   Feb. 6, 2014

(30) Foreign Application Priority Data
Aug. 1, 2012   (TW) .............................. 101127833 A

(51) Int. Cl.
*F21V 5/04*   (2006.01)
*F21V 8/00*   (2006.01)
*G02F 1/1335*   (2006.01)

(52) U.S. Cl.
CPC ............ *G02B 6/0068* (2013.01); *G02B 6/0073* (2013.01); *G02F 1/133603* (2013.01); *G02B 6/0096* (2013.01)
USPC ..................... 362/97.2; 362/244; 362/311.02; 362/311.09; 362/311.1

(58) Field of Classification Search
CPC .. G02B 6/0068; G02B 6/0066; G02B 6/0073; G02B 6/0096; G02F 1/133602; G02F 1/133603; G02F 1/133606; G02F 1/133611; G02F 2001/133607
USPC ................... 362/97.2, 238, 244, 246, 311.02, 362/311.06, 311.09, 311.1, 311.14, 646
See application file for complete search history.

(56) References Cited

U.S. PATENT DOCUMENTS

| | | | |
|---|---|---|---|
| 2006/0138437 A1* | 6/2006 | Huang et al. | 257/98 |
| 2008/0043466 A1* | 2/2008 | Chakmakjian et al. | 362/237 |
| 2008/0100773 A1* | 5/2008 | Hwang et al. | 362/235 |
| 2009/0231846 A1* | 9/2009 | Nakajima | 362/237 |

* cited by examiner

*Primary Examiner* — Y M Lee
(74) *Attorney, Agent, or Firm* — Novak Druce Connolly Bove + Quigg LLP

(57) ABSTRACT

A circular LED light guide includes a top wall and a peripheral side wall; the top wall and the peripheral side wall cooperatively form a hollow receiving space. The hollow receiving space is used for receiving an LED therein. The top wall includes a light incident surface inside of the receiving space, and an exterior light output surface. The light incident surface includes a concave lens surface formed in a central area of the light incident surface, and the light output surface includes a convex lens surface formed in a central area of the light output surface. A central optical axis of the concave lens surface is aligned with a central optical axis of the convex lens surface. An LED module and a direct-type LED TV using the LED light guide are also provided.

6 Claims, 4 Drawing Sheets

LED LIGHT GUIDE, LED LIGHT SOURCE MODULE AND DIRECT-TYPE LED TV

CROSS-REFERENCE TO RELATED APPLICATION

This application is related to a commonly-assigned co-pending application entitled "LED LIGHT GUIDE, LED LIGHT SOURCE MODULE AND DIRECT-TYPE LED TV" (U.S. patent application Ser. No. 13/711,658, filed Dec. 12, 2012). The above-identified application is filed simultaneously with the present application. The entire disclosure of the above-identified application is incorporated herein by reference.

BACKGROUND

1. Technical Field

The present disclosure relates to an LED light guide, and an LED light source module and a direct-type LED TV using the LED light guide.

2. Description of Related Art

Light emitting diodes (LEDs) are used as point light sources. In order to make the LED light diffuse and disperse as required, a diffusion plate with light scattering particles dispersed therein is arranged above the LEDs. However, hot spots may form on the diffusion plate, and in order to avoid the hot spots, a certain distance between the LED and the diffusion plate has to be maintained, whereby the minimum thickness of an LED light source module and a direct-type LED TV is limited.

What is needed, therefore, is an LED light guide, LED light source module and direct-type LED TV, which can overcome the above shortcomings.

BRIEF DESCRIPTION OF THE DRAWINGS

Many aspects of the present LED light guide, LED light source module and direct-type LED TV can be better understood with reference to the following drawings. The components in the drawings are not necessarily drawn to scale, the emphasis instead being placed upon clearly illustrating the principles of the present LED light guide, LED light source module and direct-type LED TV. Moreover, in the drawings, like reference numerals designate corresponding parts throughout the several views.

DETAILED DESCRIPTION

Embodiments of the present LED light guide, LED light source module and direct-type LED TV will be described with reference to the drawings.

Figure 1:
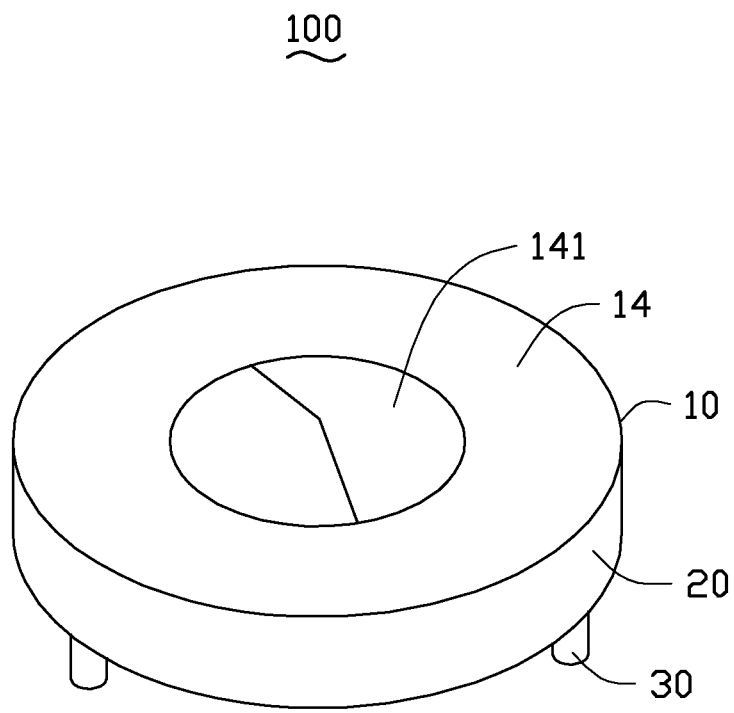
FIG. 1 is a schematic isometric view of a LED light guide in accordance with an embodiment.
Figure 2:
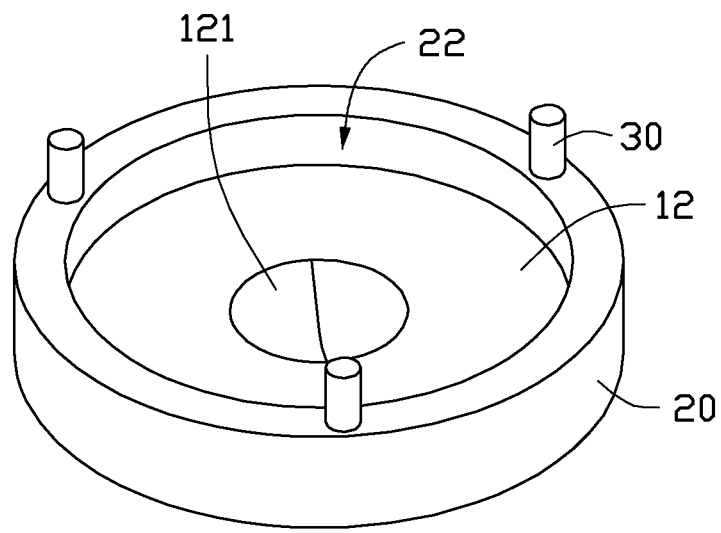
FIG. 2 is similar to FIG. 1, but viewed from an opposite direction.

Referring to FIGS. 1 and 2, a circular LED light guide 100 includes a top wall 10, a peripheral side wall 20, and a plurality of guide posts 30. The top wall 10 and the peripheral side wall 20 cooperatively form a hollow receiving space 22 for receiving an LED.

In the present embodiment, the top wall 10 is circular and the peripheral side wall 20 is a deep ring or cylinder. In another embodiment, the top wall 10 and the peripheral side wall 20 can be other shapes, such as rectangular.

The guide posts 30 are formed at an end surface of the peripheral side wall 20 away from the top wall 10. The guide posts 30 are configured to be inserted into a circuit board of the LED, thereby fixing the LED light guide 100 in position. In the present embodiment, the number of the guide posts 30 is three.

The top wall 10 includes a light incident surface 12 inside the receiving space 22, and an exterior light output surface 14. The light incident surface 12 includes a concave lens surface 121 formed in a central area of the light incident surface 12, and the light output surface 14 includes a convex lens surface 141 formed in a central area of the light output surface 14. An optical axis of the light incident surface 12 is aligned with an optical axis of the light output surface 14. Each of the concave lens surface 121 and convex lens surface 141 can be a spherical or aspheric surface.

The entire LED light guide 100 can be integral. The concave lens surface 121 forms a first diffusion stage for the LED light, such that heat generated by the LED does not focus on any point, thereby reducing or removing potential hot points. The convex lens surface 141 further diffuses the LED light, thereby improving the diffusion effect.

Figure 3:
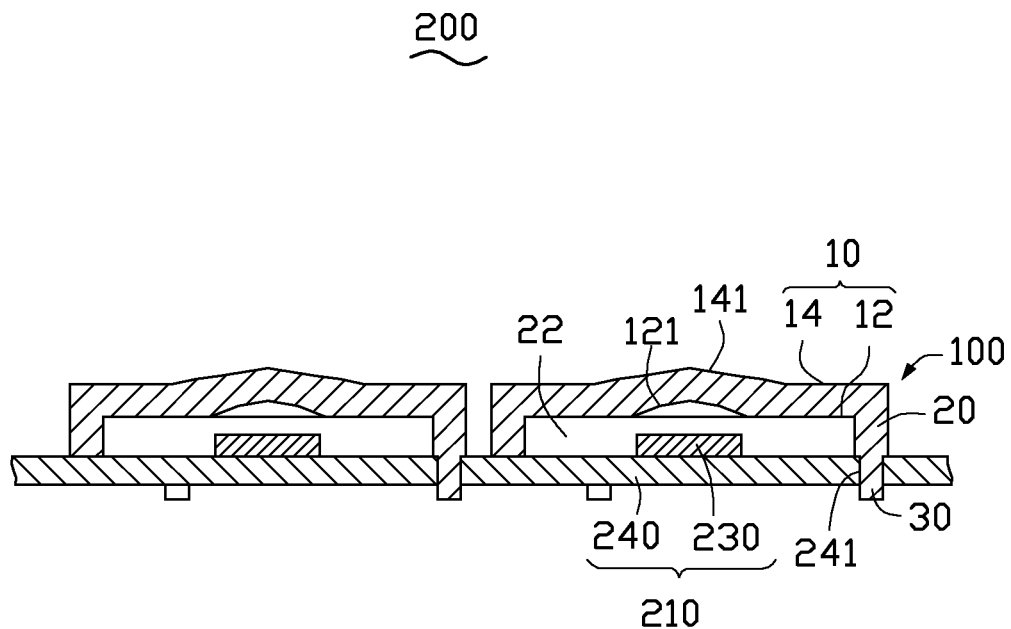
FIG. 3 is a schematic cross sectional view of a LED light source module in accordance with an embodiment.

Referring to FIG. 3, an LED light source module 200 includes an LED module 210 and a number of LED light guides 100. The LED module 210 includes a printed circuit board 240 and a number of LEDs 230 arranged in an array on the printed circuit board 240. Each of the LEDs 230 is received in one receiving space 22 of one of the LED light guides 100. The guide posts 30 of each of the LED light guides 100 are inserted in positioning holes 241 of the printed circuit board 240.

The concave lens surface 121 and the convex lens surface 141 each have a diffusing effect on the LED light, such that a distance between the LED 230 and the LED light guide 100 can be decreased without causing a hot point. In addition, because of the diffusion effects of the concave lens surface 121 and the convex lens surface 141, extra diffusion plates for the LED light source module 200 are not required.

Figure 4:
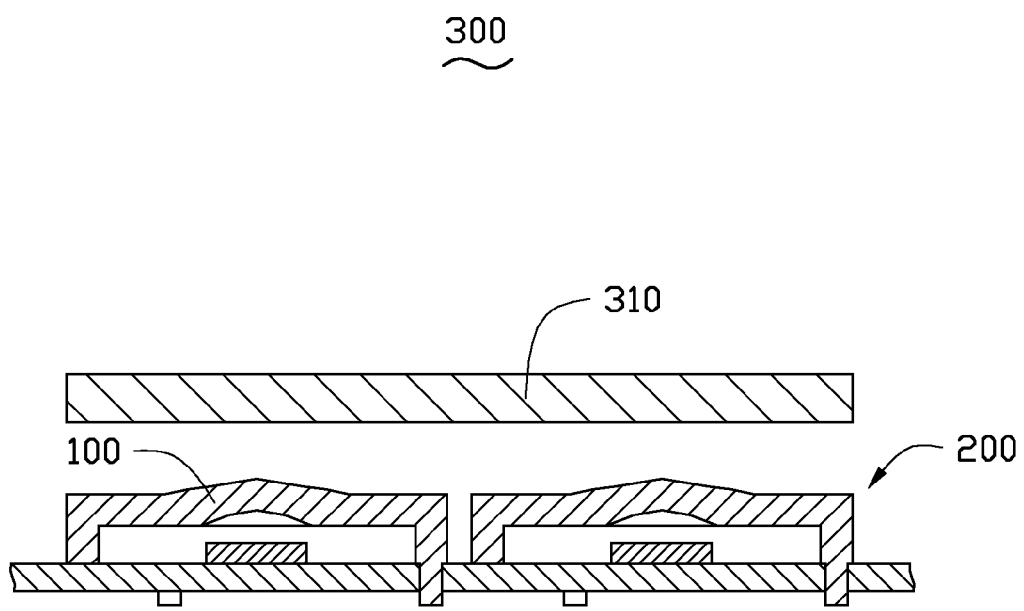
FIG. 4 is a schematic cross sectional view of a direct-type LED TV in accordance with an embodiment.

Referring to FIG. 4, a direct-type LED TV 300 includes a display panel 310 arranged above the LED light guide 100 of the LED light source module 200. The display panel 310 receives light travelling through the LED light guide 100. The direct-type LED TV 300 does not need any extra diffusion plates between the display panel 310 and the LED light source module 200.

As the LED light source module 200 can be thin, the direct-type LED TV 300 can be correspondingly thin.

It is understood that the above-described embodiments are intended to illustrate rather than to limit the disclosure. Variations may be made to the embodiments and methods without departing from the spirit of the disclosure. Accordingly, the appended claims should be construed broadly and in a manner consistent with the scope of the disclosure.

What is claimed is:

1. An LED (light emitting diode) light guide having an optical axis and comprising a top wall and a peripheral side wall, the top wall and the peripheral side wall cooperatively forming a hollow receiving space configured for receiving an LED therein, the top wall comprising a light incident surface inside of the receiving space, and a light output surface opposite to the light incident surface and exposed to outside, the light incident surface comprising a smooth concave lens formed in a central area of the light incident surface, and the light output surface comprising a smooth convex lens formed in a central area of the light output surface, a central optical axis of the concave lens being aligned with a central optical axis of the convex lens; and wherein portions of the light incident surface and the light output surface are planar surfaces perpendicular to the optical axis of the light guide.

2. The LED light guide of claim 1, further comprising a plurality of guide posts formed at an end surface of the peripheral side wall away from the top wall, and configured to position the LED light guide.

3. An LED light source module, comprising:

a plurality of LED light guides each light guide having an optical axis and comprising a top wall and a peripheral side wall, the top wall and the peripheral side wall cooperatively forming a hollow receiving space, the top wall comprising a light incident surface inside of the receiving space, and a light output surface opposite to the light incident surface and exposed to outside, the light incident surface comprising a smooth concave lens formed in a central area of the light incident, and the light output surface comprising a smooth convex lens formed in a central area of the light output surface, a central optical axis of the concave lens being aligned with a central optical axis of the convex lens, wherein portions of the light incident surface and the light output surface are planar surfaces perpendicular to the optical axis of the light guide; and an LED module comprising a printed circuit board and a plurality of LEDs arranged in an array on the printed circuit board, the LED light guides covering the LEDs with the LEDs received in the respective receiving spaces of the LED light guides.

4. The LED light source module of claim 3, wherein the printed circuit board comprises a plurality of positioning holes surrounding each one of the LEDs, and each of the LED light guides comprises a plurality of guide posts formed at an end surface of the peripheral side wall away from the top wall, and configured to insert into the positioning holes.

5. A direct-type LED TV, comprising:

an LED light source module, comprising:

a plurality of LED light guides each light guide having an optical axis and comprising a top wall and a peripheral side wall, the top wall and the peripheral side wall cooperatively forming a hollow receiving space, the top wall comprising a light incident surface inside of the receiving space, and a light output surface opposite to the light incident surface and exposed to outside, the light incident surface comprising a smooth concave lens formed in a central area of the light incident surface, and the light output surface comprising a smooth convex lens formed in a central area of the light output surface, a central optical axis of the concave lens being aligned with a central optical axis of the convex lens, wherein portions of the light incident surface and the light output surface are planar surfaces perpendicular to the optical axis of the light guide; and an LED module comprising a printed circuit board and a plurality of LEDs arranged in an array on the printed circuit board, the LED light guides covering the LEDs with the LEDs received in the respective receiving spaces of the LED light guides; and a display panel arranged above the LED light source module and receiving light from the LED light source module.

6. The LED light source module of claim 5, wherein the printed circuit board comprises a plurality of positioning holes surrounding each one of the LEDs, and each of the LED light guides comprises a plurality of guide posts formed at an end surface of the peripheral side wall away from the top wall, and configured to insert into the positioning holes.

* * * * *